(12) United States Patent
Castaneda et al.

(10) Patent No.: US 7,119,631 B2
(45) Date of Patent: Oct. 10, 2006

(54) OFF-CHIP LC CIRCUIT FOR LOWEST GROUND AND VDD IMPEDANCE FOR POWER AMPLIFIER

(75) Inventors: Jesus Alfonso Castaneda, Los Angeles, CA (US); Qiang (Tom) Li, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 140 days.

(21) Appl. No.: 10/844,237

(22) Filed: May 12, 2004

(65) Prior Publication Data
US 2005/0200426 A1 Sep. 15, 2005

Related U.S. Application Data

(60) Provisional application No. 60/552,759, filed on Mar. 12, 2004.

(51) Int. Cl.
*H03H 7/38* (2006.01)
(52) U.S. Cl. ............... 333/32; 330/302; 330/305

(58) Field of Classification Search ............. 330/302, 330/305, 307, 32, 33
See application file for complete search history.

(56) References Cited

U.S. PATENT DOCUMENTS

| 4,864,250 A | * | 9/1989 | Bacon | 330/277 |
| 6,636,119 B1 | * | 10/2003 | Vathulya | 330/311 |

* cited by examiner

*Primary Examiner*—Robert Pascal
*Assistant Examiner*—Kimberly E Glenn
(74) *Attorney, Agent, or Firm*—Garlick Harrison & Markison; Shayne X. Short; Kevin L. Smith

(57) ABSTRACT

Off-chip LC circuit for lowest ground and VDD impedance for power amplifier. A novel approach is made by which a chip to PCB (Printer Circuit Board) interface may be made such that the ground and VDD potential levels are effectively brought onto the die of the chip such that a true ground potential is maintained within the chip. This off-chip LC circuit operates cooperatively with an on-chip decoupling capacitor to reduce the overall effective inductance of the bond wires employed to bring signal and voltage levels from the die to the chip exterior. This circuit ensures a relatively low impedance for a PA (Power Amplifier) that is implemented within chip thereby providing for improved performance.

20 Claims, 9 Drawing Sheets off-chip LC circuit providing lowest ground and VDD impedance for PA

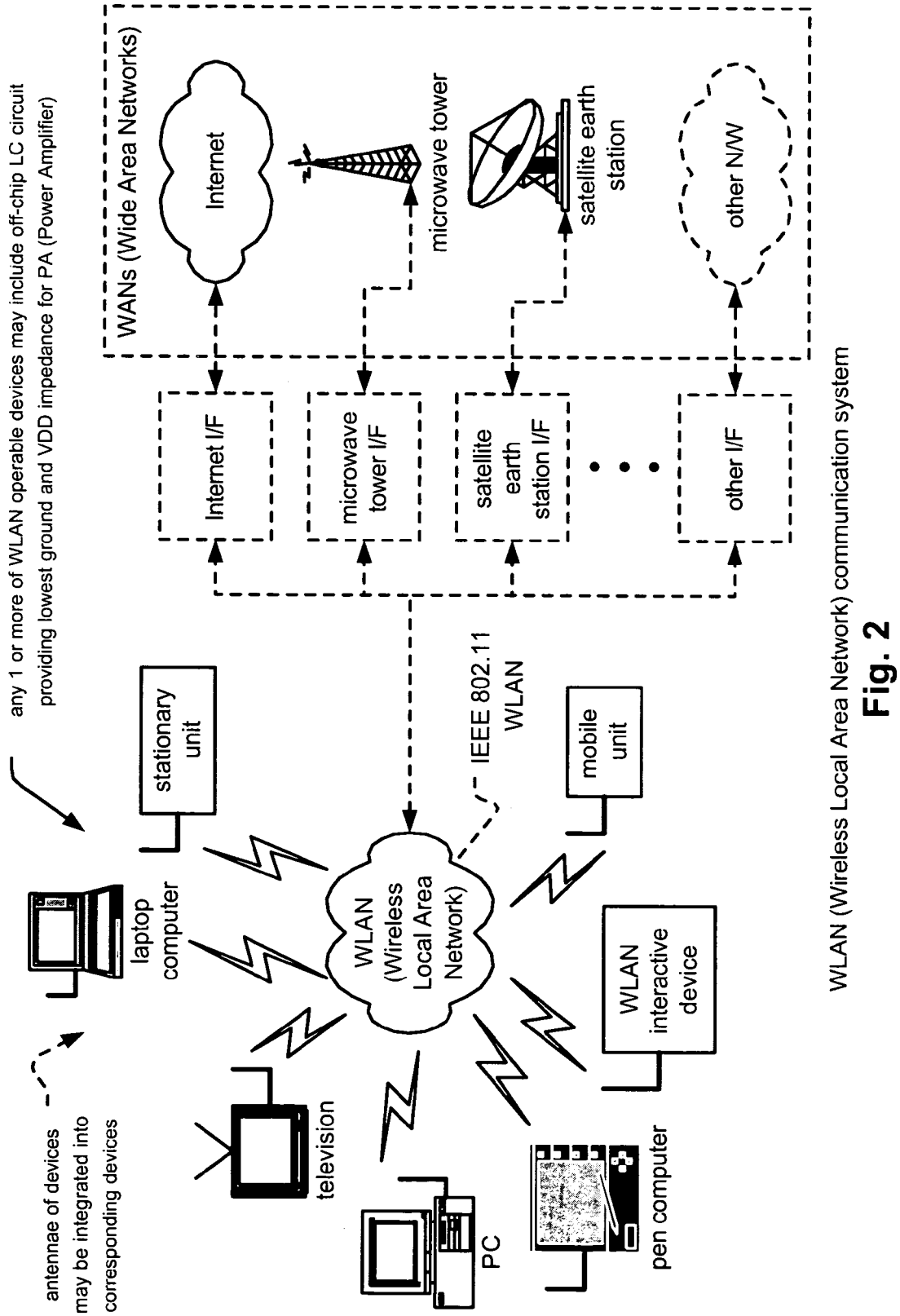

communication device supporting IEEE 802.11b functionality communication device supporting both IEEE 802.11b and BLUETOOTH® functionality method for providing a lowest ground potential and an off-chip VDD impedance to an on-chip PA (Power Amplifier)

OFF-CHIP LC CIRCUIT FOR LOWEST GROUND AND VDD IMPEDANCE FOR POWER AMPLIFIER

CROSS REFERENCE TO RELATED PATENTS/PATENT APPLICATIONS

The present U.S. Utility patent application claims priority pursuant to 35 U.S.C. § 119(e) to the following U.S. Provisional Patent Application which is hereby incorporated herein by reference in its entirety and made part of the present U.S. Utility patent application for all purposes:

1. U.S. Provisional Application Ser. No. 60/552,759, entitled "Off-chip LC circuit for lowest ground and VDD impedance for power amplifier," filed Mar. 12, 2004, pending.

BACKGROUND OF THE INVENTION

Technical Field of the Invention

The invention relates generally to communication devices; and, more particularly, it relates to connectivity of the various components and circuits within such communication devices.

Description of Related Art

Data communication systems have been under continual development for many years. Within such communication systems, there are many communication devices included therein that that include various integrated circuits, chips, modules, and functional blocks. These communication devices may be transceivers, transmitters, receivers, or even other peripheral type devices. Within these communication devices, various chips are typically mounted on a PCB (Printer Circuit Board) and are typically communicatively coupled via the PCB to other chips that are mounted thereon. The manner in these various chips communicatively couple to the PCB can introduce some serious deficiencies to the overall communication device's performance.

FIG. 1A is a diagram illustrating a prior art embodiment of a typical interface between an integrated circuit and a PCB (shown using a side view). As shown in this embodiment, a chip (e.g., which may alternatively be referred to as an encapsulated chip, package, or an integrated circuit) typically includes a die (e.g., a silicon substrate) on which a certain amount of circuitry is emplaced. This circuitry is referred to in the diagram as on substrate circuitry. Certain portions of the circuitry within this chip must communicatively couple to the PCB on which the chip is situated to transmit and receive signals, to couple voltage power levels, ground potential levels, and so on. To do this, certain nodes of the on substrate circuitry need to be communicatively coupled to the chip exterior and then to a PCB pad or trace. From there, the signal may be communicatively coupled to another appropriate portion of the PCB and, when appropriate, to another chip that may also be resident thereon. Sometimes, these signals are communicatively coupled via a backplane, or some other interface, to another device or other PCB that may also include various chips. Regardless of the final destination of how and where the communicatively coupling of these signals is to be made from the on substrate circuitry within the chip to a PCB pad or trace, the appropriate node within the on substrate circuitry must be communicatively coupled to the exterior of the chip.

The typical manner in which this is performed is to have a bond wire communicatively couple to the on substrate circuitry to the interface of the chip. From there, a pin typically extends from the interface of the chip to a PCB pad or trace on the PCB. An alternative means by which the connectivity of the bond wire between the on substrate circuitry and the exterior of the chip may be made, in an effort to reduce the impedance of the bond wire interface, is to employ two separate bond wires that are connected in parallel with one another and separated by a capacitor. This inherently reduces the impedance of the interface between the on substrate circuitry and the exterior of the chip as follows:

$Z1$=impedance of a $1^{st}$ bond wire
$Z2$=impedance of a $2^{nd}$ bond wire
$ZTOT$=total impedance of the $1^{st}$ bond wire and the $2^{nd}$ bond wire in parallel $$\frac{1}{ZTOT} = \frac{1}{Z1} + \frac{1}{Z2}$$

The capacitor between the $1^{st}$ and $2^{nd}$ bond wires provides for decoupling of the two bond wire paths.

FIG. 1B is a diagram illustrating the same prior art embodiment of a typical interface between an integrated circuit and a PCB (shown using a top view). This embodiment shows a side view of the very same components as within the previous diagram. As can be seen, a chip may have several (sometimes hundreds or even more) or pins around the periphery of the chip. Each of these pins on the chip may communicatively couple to a PCB pad or trace for subsequent coupling to another location either on this same PCB or to another location.

Within these and other similar type communication devices, the communicatively coupling between the on substrate circuitry within chips to the PCBs on which they are situated may be performed in a way that can cause problems within certain types of communication systems. For example, within the wireless communication system context, the bond wires employed therein actually act as inductors because of the relatively long lengths of the bond wires involved. In some instances, the total inductance of such of these bond wires can approach 2–4 nH (nano-Henries). These relatively large amounts of inductance can compete and interfere with the on-chip devices. In some instances, these relatively large amounts of inductance of the bond wires actually can approach the relative values of the on-chip elements (in terms of magnitude of overall impedance).

As mentioned above, within the wireless communication system context, this can be exceedingly problematic. Looking at one example of a WLAN (Wireless Local Area Network) communication system operating according to one of the IEEE (Institute of Electrical & Electronics Engineers) 802.11 standards or recommended practices whose RF (Radio Frequency) carrier frequency, f, is within the 2.4 GHz (Giga-Hertz) frequency range, the inductive-related impedance of these bond wires can be quite significant. For example, the associated impedance, ZL, of an inductor having inductance, L having a value of 1 nH, is provided as follows:

$$ZL = j\omega L = j2\pi f L = j2\pi(2.4\times10^9)(1\times10^{-9}) = j\cdot15 \; \Omega$$

That is to say, for a bond wire having an inductance of approximately 1 nH, and when the chip operates within a wireless communication system having an RF carrier frequency of approximately 2.4 GHz, the magnitude of the inductive-related impedance is quite significant (e.g., approximately 15 Ω). This magnitude is very close to the magnitudes of many of the elements within such a communication device that may operate within such a wireless communication system. In some instances, this impedance magnitude of approximately 15 Ω is even 2 or 3 times larger than some of the impedances of the various elements within the chip. In other instances, this impedance magnitude of approximately 15 Ω is nearly half or a third the magnitude of the impedance of some other elements within the chip. For one comparison example, an antenna employed within such wireless communication systems may have a characteristic impedance of approximately 30 Ω to 45 Ω with respect to ground. In such an instance, the bond wire's impedance magnitude of approximately 15 Ω is approximately a half or third of the antenna's characteristic impedance of approximately 30 Ω to 45 Ω with respect to ground. In an instance where the inductance of the bond wire is double, or even triple, this illustrative example value of 1 nH, then the impedance of the bond wire can be approximately equal in magnitude to that of the antenna's characteristic impedance.

When communicatively coupling chips to PCBs using this PA approach of bond wires extending from the on substrate circuitry to the chip exterior, this undesirably generated inductive-related impedance can cause significant deleterious effects in the overall operation of the communication device. A great deal of interference and reduction of performance of the communication device may be experienced when using these prior art approaches. Clearly, there is a need in the art for a more effective and efficient way of communicatively coupling a chip to the pads and/or traces on a PCB on which the chip may be situated.

BRIEF SUMMARY OF THE INVENTION

Various aspects of the invention can be found in an off-chip LC (inductance-capacitance) circuit that communicatively couples to an integrated circuit. This circuit may be implemented using two separate RF (Radio Frequency) chokes and strategically placed capacitors: an off-chip joining capacitor and an off-chip tuning capacitor. A first RF choke communicatively couples an off-chip supply potential node to a first pin of the integrated circuit. The first pin connects to an on-chip supply potential node of a die that is implemented within the integrated circuit. The on-chip supply potential node powers an on-chip PA (Power Amplifier) that is implemented within the die. A second RF choke communicatively couples an off-chip ground potential node to a second pin of the integrated circuit. The second pin connects to an on-chip ground potential node of the die, and the on-chip ground potential node serves as an on-chip ground reference of the on-chip PA. The off-chip joining capacitor whose ends communicatively couple to each of the first pin and the second pin of the integrated circuit, and the off-chip tuning capacitor whose ends communicatively couple to the first pin of the integrated circuit and an off-chip true ground potential node.

In certain embodiments, the integrated circuit includes an on-chip decoupling capacitor whose ends communicatively couple to the on-chip supply potential node and the on-chip ground potential node. In some embodiments, the first pin connects to an the on-chip supply potential node of the die via a first bond wire; the second pin connects to an the on-chip ground potential node of the die via a second bond wire; and a third pin of the integrated circuit connects to an output of the on-chip PA via a third bond wire. A first interface from an exterior of the integrated circuit to the die of the integrated circuit that includes the first pin and the first bond wire is characterized by a first PBWM (Package Bond Wire Model) having a first impedance; a second interface from the exterior of the integrated circuit to the die of the integrated circuit that includes the second pin and the second bond wire is characterized by a second PBWM having a second impedance; and a third interface from the exterior of the integrated circuit to the die of the integrated circuit that includes the third pin and the third bond wire is characterized by a third PBWM having a third impedance. The third pin may be communicatively coupled to an antenna. In such instances where the integrated circuit includes an on-chip decoupling capacitor whose ends communicatively couple to the on-chip supply potential node and the on-chip ground potential node, the on-chip decoupling capacitor and the off-chip joining capacitor operate cooperatively to reduce an effective inductance associated with each of the first PBWM and the second PBWM.

The capacitance value of the off-chip tuning capacitor may be selected such that the capacitive-related impedance corresponding to the off-chip tuning capacitor substantially cancels a parallel combination of the first impedance and the second impedance that correspond to the first PBWM and the second PBWM, respectively.

The first RF choke substantially blocks any AC (Alternating Current) signal from being transmitted between the off-chip supply potential node and the first pin, and the second RF choke substantially blocks any AC signal from being transmitted between the off-chip ground potential node and the second pin. The first RF choke operates as a short circuit with respect to any DC (Direct Current) signal being transmitted between the off-chip supply potential node and the first pin, and the second RF choke operates as a short circuit with respect to any DC signal being transmitted between the off-chip ground potential node and the second pin.

The off-chip tuning capacitor and the off-chip joining capacitor cooperatively provide a shunt path for any AC signal existent at either of the first pin or the second pin. This integrated circuit may be implemented within any of a wide variety of devices including communication devices. In some instances, the integrated circuit is implemented within a communication device that supports wireless communication according to at least one of an IEEE (Institute of Electrical & Electronics Engineers) 802.11b standard and an IEEE 802.15.1 BLUETOOTH® core.

The invention envisions any type of communication device that supports the functionality and/or processing described herein. Moreover, various types of methods may be performed to support the functionality described herein without departing from the scope and spirit of the invention as well.

BRIEF DESCRIPTION OF THE SEVERAL VIEWS OF THE DRAWINGS

FIG. 2 is a diagram illustrating an embodiment of a WLAN (Wireless Local Area Network) communication system that may be implemented according to the invention.

DETAILED DESCRIPTION OF THE INVENTION

Figure 1A:
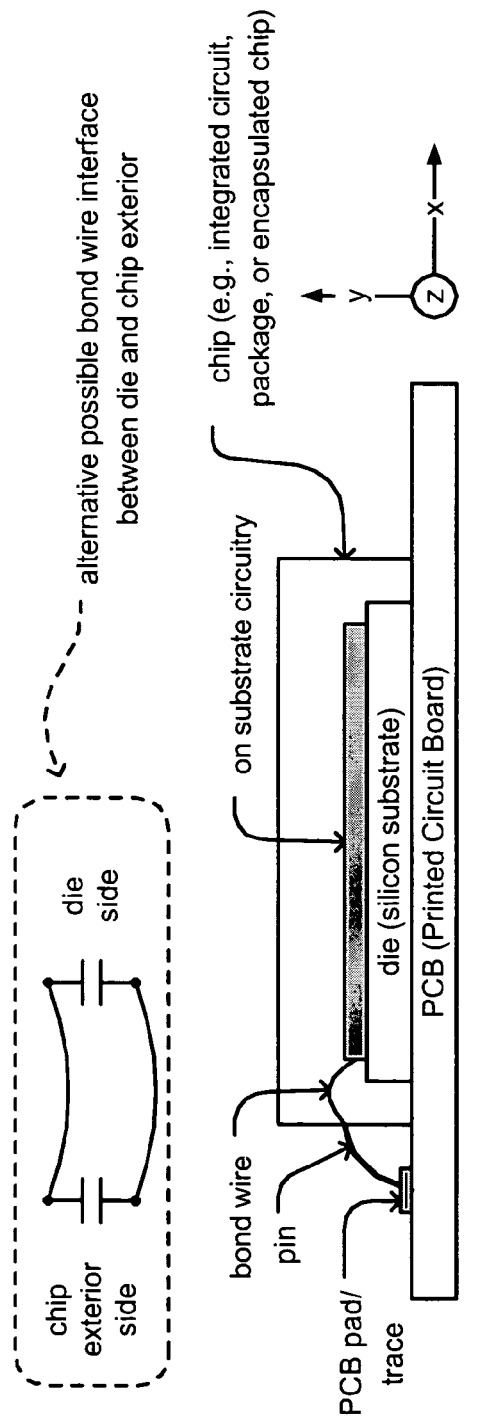
FIG. 1A is a diagram illustrating a prior art embodiment of a typical interface between an integrated circuit and a PCB (shown using a side view).
Figure 1B:
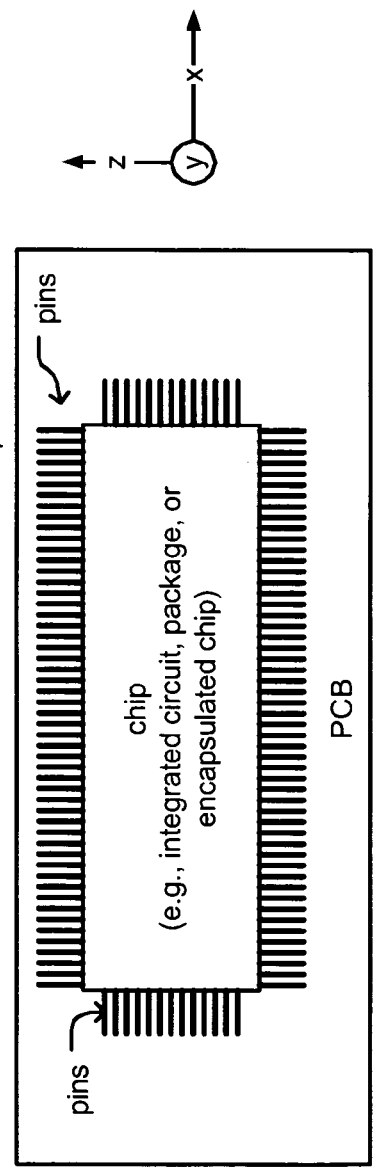
FIG. 1B is a diagram illustrating the same prior art embodiment of a typical interface between an integrated circuit and a PCB (shown using a top view).

Communication systems are known to support wireless and wire lined communications between wireless and/or wire lined communication devices. Such communication systems range from national and/or international cellular telephone systems to the Internet to point-to-point in-home wireless networks, among other communication system types. Each type of communication system is constructed, and hence operates, in accordance with one or more communication standards. For instance, wireless communication systems may operate in accordance with one or more standards including, but not limited to, IEEE (Institute of Electrical & Electronics Engineers) 802.11, BLUE-TOOTH® (e.g., the IEEE 802.15.1 BLUETOOTH® core), AMPS (Advanced Mobile Phone Services), digital AMPS, GSM (Global System for Mobile communications), CDMA (Code Division Multiple Access), LMDS (Local Multi-point Distribution Systems), MMDS (Multi-channel-Multi-point Distribution Systems), and/or variations thereof.

Depending on the type of wireless communication system, a wireless communication device, such as a cellular telephone, two-way radio, PDA (Personal Digital Assistant), PC (Personal Computer), laptop computer, home entertainment equipment, et cetera, communicates directly or indirectly with other wireless communication devices. For direct communications (also known as point-to-point communications), the participating wireless communication devices tune their receivers and transmitters to the same channel or channels (e.g., one of the plurality of RF (Radio Frequency) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the PSTN (Public Switch Telephone Network), via the Internet, and/or via some other WAN (Wide Area Network).

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). A transmitter of such a communication device includes a data modulation stage, one or more IF (Intermediate Frequency) stages, and a PA (Power Amplifier). The data modulation stage converts raw data into baseband signals in accordance with a particular wireless communication standard. The one or more IF stages mix the baseband signals with one or more local oscillations to produce RF signals. The PA amplifies the RF signals prior to transmission via an antenna.

A receiver of such a communication device is coupled to the antenna and includes a LNA (Low Noise Amplifier), one or more IF stages, a filtering stage, and a data recovery stage. The LNA receives inbound RF signals via the antenna and amplifies them. The one or more IF stages mix the amplified RF signals with one or more local oscillations to convert the amplified RF signal into baseband signals or IF signals. The filtering stage filters the baseband signals or the IF signals to attenuate unwanted out of band signals to produce filtered signals. The data recovery stage recovers raw data from the filtered signals in accordance with the particular wireless communication standard.

It is also noted that certain variations of such communication devices perform frequency conversion directly from carrier frequency (e.g. RF frequency in some instances) to baseband and vice versa. That is to say, direct conversion of such frequencies may be performed within a communication device that operates according to certain aspects of the invention without departing from the scope and spirit of the invention thereof.

Within these various types of communication systems, there is inherently a need to communicatively couple the various integrated circuits, modules, and functional blocks therein such that they may operate cooperatively to perform their individual respective operations in conjunction with the other parts of the communication device. A novel approach is presented herein by which an interface may be made between a chip (e.g., an integrated circuit) and a PCB (Printer Circuit Board) on which the chip is mounted. The approach for connecting the chip to the PCB is provided in such a way that any inductance of the bond wires used to do so have a very good value for ground potential of the circuitry within the chip and any other electronic components implemented within the chip.

That is to say, the electrical potential for ground on the PCB and the chip are provided as being as close to one another as possible. In a specific implementation, the interface of the chip to the PCB is performed with respect to the interface of a PA (Power amplifier) functional block. This PA functional block may be a stand-alone integrated circuit, or the PA may be a functional block resident within a larger integrated circuit that includes many other functional blocks in addition to the PA. In whichever case, a novel and effective approach is presented herein by which an off-chip LC (inductance-capacitance) circuit may be implemented to provide for a lowest possible ground and VDD impedance for the PA.

This novel approach by which the interfacing between an integrated circuit having a PA may be performed can be implemented within any number of communication devices that may be implemented within any of a variety of communication systems. For example, the functionality of the invention may be found in a variety of communication devices including those that operate according to the various standards and recommended practices that are provided under the umbrella of the IEEE 802.11 working group and/or the Wi-Fi Alliance (e.g., including the IEEE 802.11a standard, the IEEE 802.11b standard, and the IEEE 802.11g standard). Moreover, the functionality of the invention may also be found in communication devices that operate according to the wireless BLUETOOTH® communication standard and other wireless standards including the various standards and recommended practices that are provided under the umbrella of the IEEE (Institute of Electrical & Electronics Engineers) 802.15 working group (e.g., including the IEEE 802.15.1 BLUETOOTH® core, the IEEE 802.15.2 recommended practice specification, the IEEE 802.15.3 high data rate PAN standard, and the IEEE 802.15.3 WPAN (Wireless Personal Area Network) High Rate Alternative PHY Task Group 3a (TG3a) which is sometimes referred to the IEEE 802.15.3a extended high data rate PAN standard).

In addition, the functionality of the invention may be implemented within a variety of types of communication devices including those operable within various wireline and/or wireless based communication systems. This functionality may also be implemented within a monolithic single chip design of an integrated circuit that may be employed within a wireless (e.g., IEEE 802.11b and/or BLUETOOTH®) transceiver or other type device that is part of a larger communication system. Moreover, this functionality may also be found within a mouse, keyboard, or other type peripheral type device that is part of a larger computer type system in a cable replacement implementation approach such that each of these peripheral type devices may be viewed as being a transceiver.

FIG. 2 is a diagram illustrating an embodiment of a WLAN (Wireless Local Area Network) communication system that may be implemented according to the invention. The WLAN communication system may be implemented to include a number of devices that are all operable to communicate with one another via the WLAN. For example, the various devices that each include the functionality to interface with the WLAN may include any 1 or more of a laptop computer, a television, a PC (Personal Computer), a pen computer (that may be viewed as being a PDA (Personal Digital Assistant) in some instances, a personal electronic planner, or similar device), a mobile unit (that may be viewed as being a telephone, a pager, or some other mobile WLAN operable device), and/or a stationary unit (that may be viewed as a device that typically resides in a single location within the WLAN). The antennae of any of the various WLAN interactive devices may be integrated into the corresponding devices without departing from the scope and spirit of the invention as well.

This illustrated group of devices that may interact with the WLAN is not intended to be an exhaustive list of devices that may interact with a WLAN, and a generic device shown as a WLAN interactive device represents any communication device that includes the functionality in order to interactive with the WLAN itself and/or the other devices that are associated with the WLAN. Any one of these devices that associate with the WLAN may be viewed generically as being a WLAN interactive device without departing from the scope and spirit of the invention. Each of the devices and the WLAN interactive device may be viewed as being located at respective nodes of the WLAN.

It is also noted that the WLAN itself may also include functionality to allow interfacing with other networks as well. These external networks may generically be referred to as WANs (Wide Area Networks). For example, the WLAN may include an Internet I/F (interface) that allows for interfacing to the Internet itself. This Internet I/F may be viewed as being a base station device for the WLAN that allows any one of the WLAN interactive devices to access the Internet.

It is also noted that the WLAN may also include functionality to allow interfacing with other networks (e.g., other WANs) besides simply the Internet. For example, the WLAN may include a microwave tower I/F that allows for interfacing to a microwave tower thereby allowing communication with one or more microwave networks. Similar to the Internet I/F described above, the microwave tower I/F may be viewed as being a base station device for the WLAN that allows any one of the WLAN interactive devices to access the one or more microwave networks via the microwave tower.

Moreover, the WLAN may include a satellite earth station I/F that allows for interfacing to a satellite earth station thereby allowing communication with one or more satellite networks. The satellite earth station I/F may be viewed as being a base station device for the WLAN that allows any one of the WLAN interactive devices to access the one or more satellite networks via the satellite earth station I/F.

This finite listing of various network types that may interface to the WLAN is also not intended to be exhaustive. For example, any other network may communicatively couple to the WLAN via an appropriate I/F that includes the functionality for any one of the WLAN interactive devices to access the other network.

Any of the various WLAN interactive devices described within this embodiment may include an encoder and a decoder to allow bi-directional communication with the other WLAN interactive device and/or the WANs. The encoder of any of these various WLAN interactive devices may be implemented to encode information (using its corresponding encoder) in a manner in accordance with various communication standards and/or protocols of the WLAN communication system. Analogously, the decoder of any of the various WLAN interactive devices may be implemented to decode the transmitted signal (using its corresponding decoder) in a manner that also comports with the various communication standards and/or protocols of the WLAN communication system. This diagram shows just one of the many possible communication system embodiment types in which various communication devices may be implemented that can include any one or more of the various aspects of the invention. Within any one of these communication devices, an off-chip LC (inductance-capacitance) circuit may be implemented to provide for a lowest possible ground and VDD impedance for the PA that is implemented therein.

In some instances, any one of the WLAN interactive devices may be characterized as being an IEEE 802.11 operable device. For example, such an 802.11 operable device may be an 802.11a operable device, an 802.11b operable device, an 802.11g operable device, or an 802.11n operable device. Sometimes, an IEEE 802.11 operable device is operable to communicate according to more than one of the standards (e.g., both 802.11a and 802.11g in one instance). The IEEE 802.11g specification extends the rates for packet transmission in the 2.4 GHz (Giga-Hertz) frequency band. This is achieved by allowing packets, also known as frames, of two distinct types to coexist in this band. Frames utilizing DSSS/CCK (Direct Sequence Spread Spectrum with Complementary Code Keying) have been specified for transmission in the 2.4 GHz band at rates up to 11 Mbps (Mega-bits per second) as part of the 802.11b standard. The IEEE 802.11b standard may also operate in the 2.4 GHz spectrum using CSMA/CA (Carrier Sense Multiple Access with Collision Avoidance) as its media access approach. The 802.11a standard uses a different frame format with OFDM (Orthogonal Frequency Division Multiplexing) to transmit at rates up to 54 Mbps with carrier frequencies in the 5 GHz range. The 802.11g specification allows for such OFDM frames to coexist with DSSS/CCK frames at 2.4 GHz.

Regardless of which type of communication device and which type of communication system in which a communication device may be implemented, the novel approach by which an integrated circuit may be interfaced to a PCB and/or another integrated circuit may be used to provide for improved performance of that particular communication device and the overall communication system. Various other embodiments are also described below to show some of the various types of communication devices and/or communication systems in which certain aspects of the invention may be found.

Figure 3:
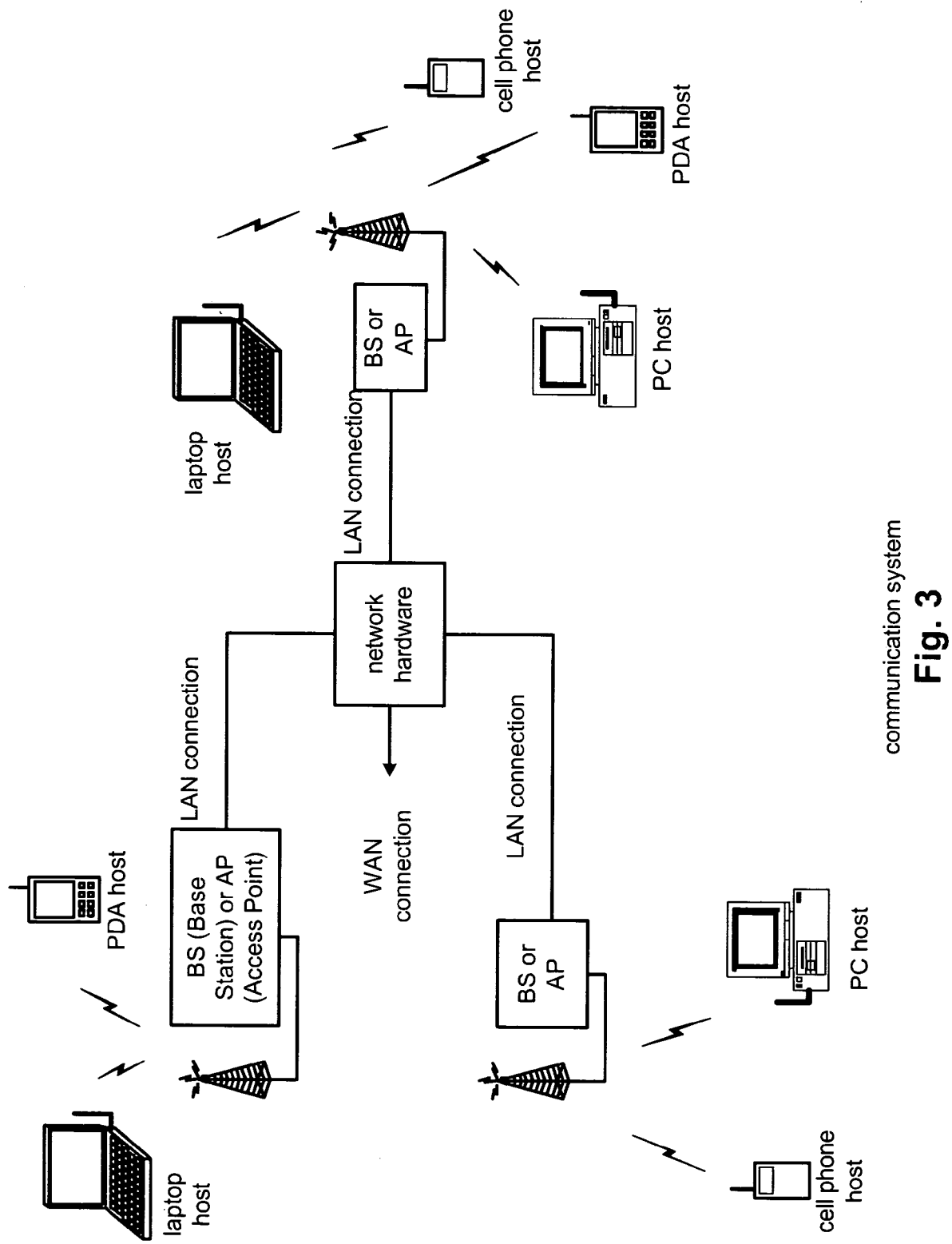
FIG. 3 is a schematic block diagram illustrating a communication system that includes a plurality of base stations and/or access points, a plurality of wireless communication devices and a network hardware component in accordance with certain aspects of the invention.

FIG. 3 is a schematic block diagram illustrating a communication system that includes a plurality of base stations and/or access points, a plurality of wireless communication devices and a network hardware component in accordance with certain aspects of the invention. The wireless communication devices may be laptop host computers, PDA (Personal Digital Assistant) hosts, personal computer hosts and/or cellular telephone hosts. The details of any one of these wireless communication devices is described in greater detail with reference to FIG. 4 below.

The BSs (Base Stations) or APs (Access Points) are operably coupled to the network hardware via the respective LAN (Local Area Network) connections. The network hardware, which may be a router, switch, bridge, modem, system controller, et cetera, provides a WAN (Wide Area Network) connection for the communication system. Each of the BSs or APs has an associated antenna or antenna array to communicate with the wireless communication-devices in its area. Typically, the wireless communication devices register with a particular BS or AP to receive services from the communication system. For direct connections (i.e., point-to-point communications), wireless communication devices communicate directly via an allocated channel.

Typically, BSs are used for cellular telephone systems and like-type systems, while APs are used for in-home or in-building wireless networks. Regardless of the particular type of communication system, each wireless communication device includes a built-in radio and/or is coupled to a radio. The radio includes a highly linear amplifier and/or programmable multi-stage amplifier as disclosed herein to enhance performance, reduce costs, reduce size, and/or enhance broadband applications.

Figure 4:
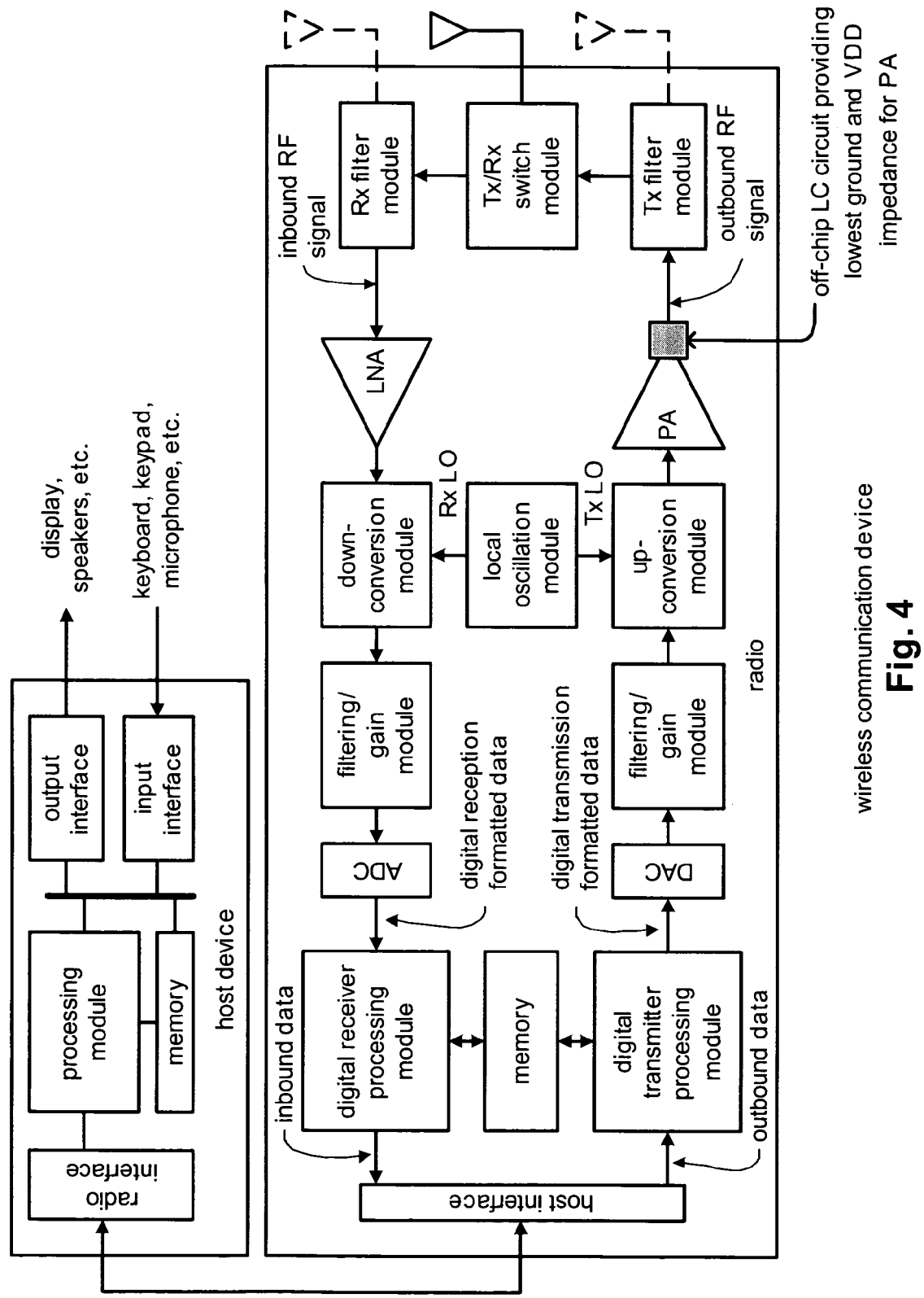
FIG. 4 is a schematic block diagram illustrating a wireless communication device that includes the host device and an associated radio in accordance with certain aspects of the invention.

FIG. 4 is a schematic block diagram illustrating a wireless communication device that includes the host device and an associated radio in accordance with certain aspects of the invention. For cellular telephone hosts, the radio is a built-in component. For PDA PDA (Personal Digital Assistant) hosts, laptop hosts, and/or personal computer hosts, the radio may be built-in or an externally coupled component.

As illustrated, the host device includes a processing module, memory, radio interface, input interface and output interface. The processing module and memory execute the corresponding instructions that are typically done by the host device. For example, for a cellular telephone host device, the processing module performs the corresponding communication functions in accordance with a particular cellular telephone standard.

The radio interface allows data to be received from and sent to the radio. For data received from the radio (e.g., inbound data), the radio interface provides the data to the processing module for further processing and/or routing to the output interface. The output interface provides connectivity to an output display device such as a display, monitor, speakers, et cetera such that the received data may be displayed. The radio interface also provides data from the processing module to the radio. The processing module may receive the outbound data from an input device such as a keyboard, keypad, microphone, et cetera, via the input interface or generate the data itself. For data received via the input interface, the processing module may perform a corresponding host function on the data and/or route it to the radio via the radio interface.

The radio includes a host interface, a digital receiver processing module, an ADC (Analog to Digital Converter), a filtering/gain module, an IF (intermediate Frequency) mixing down conversion stage, a receiver filter, an LNA (Low Noise Amplifier), a transmitter/receiver switch, a local oscillation module, memory, a digital transmitter processing module, a DAC (Digital to Analog Converter), a filtering/gain module, an IF mixing up conversion stage, a PA (Power Amplifier), a transmitter filter module, and an antenna. The antenna may be a single antenna that is shared by the transmit and the receive paths as regulated by the Tx/Rx (Transmit/Receive) switch, or may include separate antennas for the transmit path and receive path. The antenna implementation will depend on the particular standard to which the wireless communication device is compliant.

The digital receiver processing module and the digital transmitter processing module, in combination with operational instructions stored in memory, execute digital receiver functions and digital transmitter functions, respectively. The digital receiver functions include, but are not limited to, digital IF (Intermediate Frequency) to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules may be implemented using a shared processing device, individual processing devices, or a plurality of processing devices. Such a processing device may be a microprocessor, microcontroller, DSP (Digital Signal Processor), microcomputer, CPU (Central Processing Unit), FPGA (Field Programmable Gate Array), programmable logic device, state machine, logic circuitry, analog circuitry, digital circuitry, and/or any device that manipulates signals (analog and/or digital) based on operational instructions. The memory may be a single memory device or a plurality of memory devices. Such a memory device may be a ROM (Read Only Memory), RAM (Random Access Memory), volatile memory, non-volatile memory, static memory, dynamic memory, flash memory, and/or any device that stores digital information. It is noted that when either of the digital receiver processing module or the digital transmitter processing module implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio receives outbound data from the host device via the host interface. The host interface routes the outbound data to the digital transmitter processing module, which processes the outbound data in accordance with a particular wireless communication standard (e.g., IEEE 802.11, BLUETOOTH®, et cetera) to produce digital transmission formatted data. The digital transmission formatted data is a digital base-band signal or a digital low IF signal, where the low IF typically will be in the frequency range of one hundred kHz (kilo-Hertz) to a few MHz (Mega-Hertz).

The DAC converts the digital transmission formatted data from the digital domain to the analog domain. The filtering/gain module filters and/or adjusts the gain of the analog signal prior to providing it to the IF mixing stage. The IF mixing stage converts the analog baseband or low IF signal into an RF signal based on a transmitter local oscillation provided by local oscillation module. The PA amplifies the RF signal to produce outbound RF signal, which is filtered by the transmitter filter module. The antenna transmits the outbound RF signal to a targeted device such as a base station, an access point and/or another wireless communication device.

The radio also receives an inbound RF signal via the antenna, which was transmitted by a BS, an AP, or another wireless communication device. The antenna provides the inbound RF signal to the receiver filter module via the Tx/Rx switch, where the Rx filter bandpass filters the inbound RF signal. The Rx filter provides the filtered RF signal to the LNA, which amplifies the signal to produce an amplified inbound RF signal. The LNA provides the amplified inbound RF signal to the IF mixing module, which directly converts the amplified inbound RF signal into an inbound low IF signal or baseband signal based on a receiver local oscillation provided by local oscillation module. The down conversion module provides the inbound low IF signal or baseband signal to the filtering/gain module. The filtering/gain module filters and/or gains the inbound low IF signal or the inbound baseband signal to produce a filtered inbound signal.

The ADC converts the filtered inbound signal from the analog domain to the digital domain to produce digital reception formatted data. The digital receiver processing module decodes, descrambles, demaps, and/or demodulates the digital reception formatted data to recapture inbound data in accordance with the particular wireless communication standard being implemented by radio. The host interface provides the recaptured inbound data to the host device via the radio interface.

As one of average skill in the art will appreciate, the wireless communication device of FIG. 4 may be implemented using one or more integrated circuits. For example, the host device may be implemented on one integrated circuit, the digital receiver processing module, the digital transmitter processing module and memory may be implemented on a second integrated circuit, and the remaining components of the radio, less the antenna, may be implemented on a third integrated circuit. As an alternate example, the radio may be implemented on a single integrated circuit. As yet another example, the processing module of the host device and the digital receiver and transmitter processing modules may be a common processing device implemented on a single integrated circuit. Further, the memories of the host device and the radio may also be implemented on a single integrated circuit and/or on the same integrated circuit as the common processing modules of processing module of the host device and the digital receiver and transmitter processing module of the radio.

An integrated circuit within the wireless communication device of FIG. 4 that includes the PA may be implemented using an off-chip LC circuit to provide for a lowest possible ground and VDD impedance for the PA that is implemented therein. That is to say, the ground potential and the VDD potential of the PCB on which the integrated circuit having the PA is mounted may be effectively brought into the chip. In effect, the ground potential of the PCB is brought onto the die of the chip that has the PA using the novel off-chip LC circuit approach presented and described herein.

Figure 5:
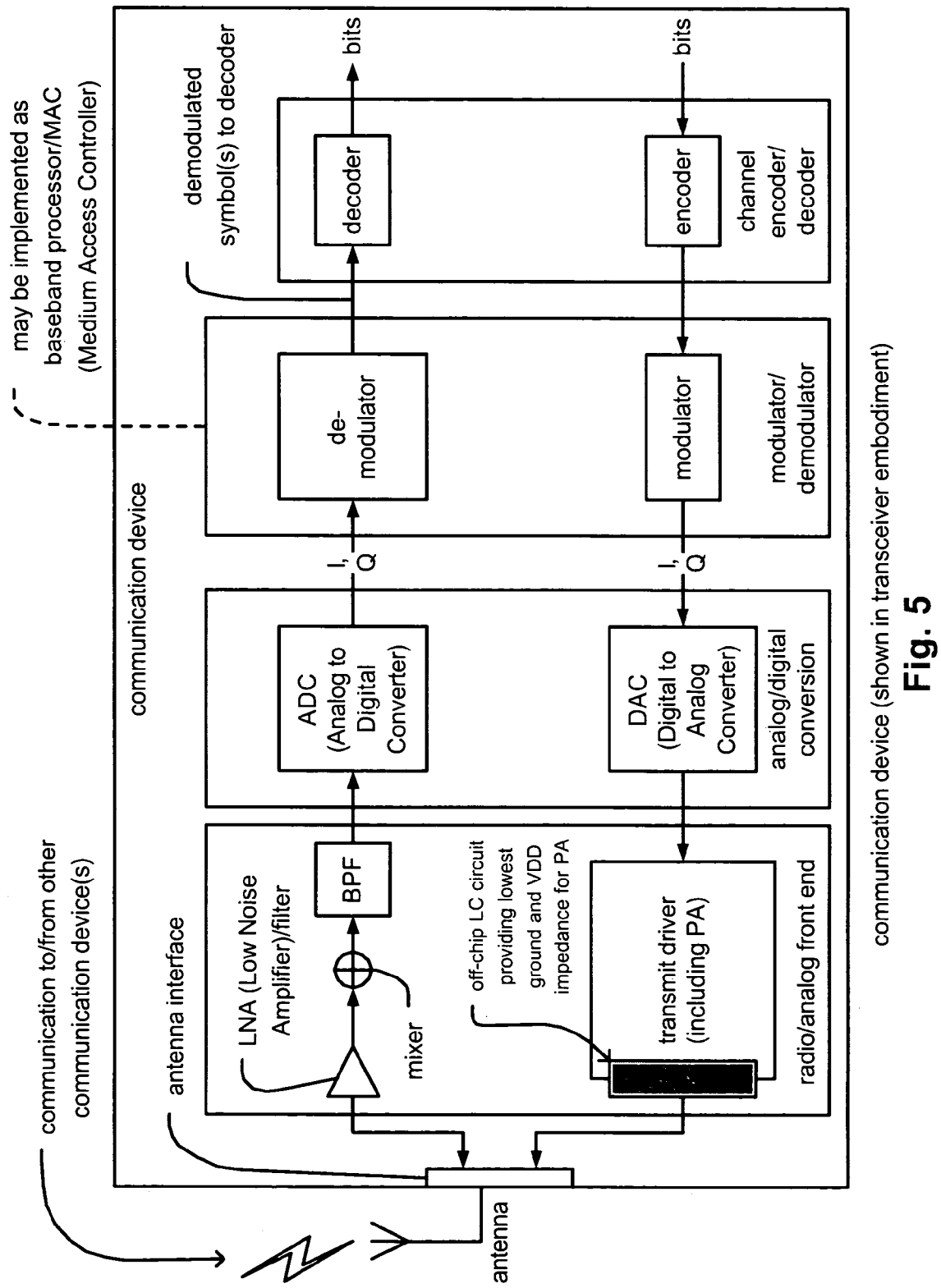
FIG. 5 is a diagram illustrating an embodiment of a communication device (shown in transceiver embodiment) that is built according to the invention.

FIG. 5 is a diagram illustrating an embodiment of a communication device that is built according to the invention. This embodiment shows a communication system that is capable of being implemented within a wireless type communication system; however, such a communication device could alternatively be implemented within a wireline type communication system as well without departing from the scope and spirit of the invention.

Being shown in a wireless context, this embodiment of a communication device includes an antenna that is operable to communicate with any 1 or more other communication devices within a given communication network. An antenna interface communicatively couples a signal to be transmitted from the communication device or a signal received by the communication device to the appropriate path (be it the transmit path or the receive path).

A radio/analog front end (that may also be referred to as "radio front end," "analog front end," "radio," and/or "front end") includes both receiver functionality and transmitter functionality. The radio front end communicatively couples to an analog/digital conversion functional block. The radio front end communicatively couples to a modulator/demodulator, and the radio front end communicatively couples to a channel encoder/decoder.

Along the Receive Path:

The receiver functionality of the radio/analog front end includes a LNA (Low Noise Amplifier)/filter. The LNA/filter is followed by a mixer that is operable to perform any modification in frequency of the received signal. Using the mixer, the receiver functionality of the front end performs any down-converting that may be required from a carrier frequency by which the received signal was transmitted. This may be performed by converting first down to an IF (Intermediate Frequency), or it may alternatively include down-converting directly from the received signal to a baseband signal (e.g. a direct conversion process). In addition, the mixer is followed by a BPF (Band Pass Filter) that is operable to tune the tuning frequency of the radio/analog front end to the appropriate frequency and therefore the appropriate channel.

Whichever particular manner is employed, a baseband signal is output from the receiver functionality of the radio/analog front end and is provided to an ADC (Analog to Digital Converter) that samples that signal and outputs the digital I, Q (In-phase, Quadrature) components of the baseband signal.

These I, Q components are provided to a demodulator portion of the modulator/demodulator where any modulation decoding/symbol mapping is performed where the digitally sampled received symbol is mapped to an appropriate modulation (that includes a constellation and corresponding mapping). Examples of such modulations may include BPSK (Binary Phase Shift Key), QPSK (Quadrature Phase Shift Key), 8 PSK (8 Phase Shift Key), 16 QAM (16 Quadrature Amplitude Modulation), and even other modulation types including higher order modulation types. The appropriately mapped symbols are then provided to a decoder portion of the channel encoder/decoder where best estimates of the information bits contained within the received symbols are made.

Along the Transmit Path:

Somewhat analogous and opposite processing is performed in the transmit path when compared to the receive path. Information bits that are to be transmitted are encoded using an encoder of the channel encoder/decoder. These encoded bits are provided to a modulator of the modulator/demodulator where modulation encoding/symbol mapping may be performed according to the modulation of interest. These now I, Q components of the symbols are then passed to a DAC (Digital to Analog Converter) of the analog/digital conversion functional block. The now analog signal to be transmitted is then passed to a transmit driver that performs any necessary up-converting/modification to the analog signal to comport it to the communication channel over which the signal is to be transmitted to another communication device via the antenna. This transmit driver may be implemented using a PA as also described above with respect to other embodiments. The chip that includes the PA may be implemented and mounted on a PCB using an off-chip LC circuit to provide for a lowest possible ground and VDD impedance for the PA that is implemented therein. As also described above with respect to other embodiments, the ground potential and the VDD potential of the PCB on which the integrated circuit having the PA is mounted may be effectively brought into the chip. In effect, the ground potential of the PCB is brought onto the die of the chip that has the PA using the novel off-chip LC circuit approach presented and described herein.

Figure 6:
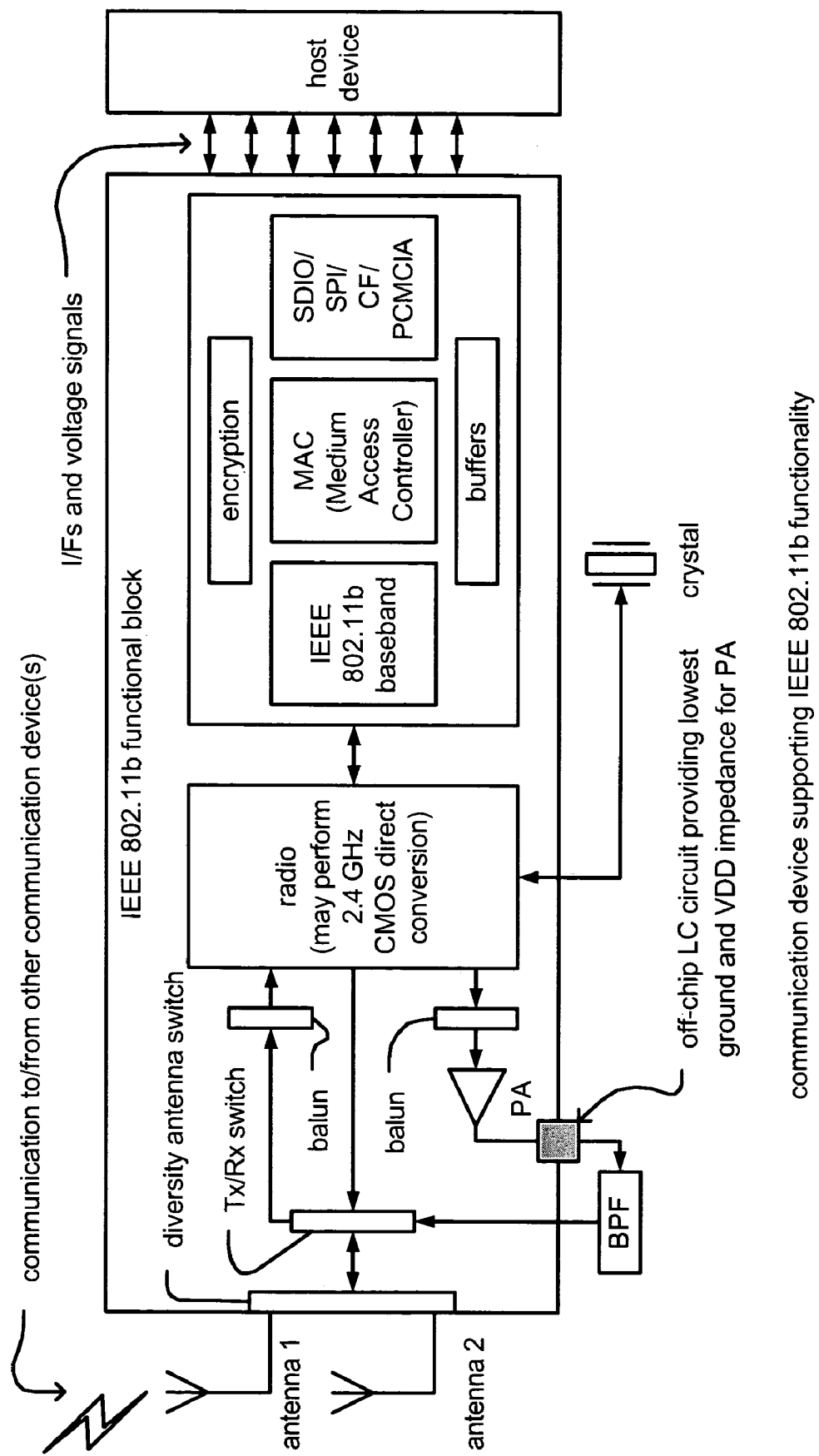
FIG. 6 is a diagram illustrating an embodiment of a communication device supporting IEEE (Institute of Electrical & Electronics Engineers) 802.11b functionality in accordance with certain aspects of the invention.

FIG. 6 is a diagram illustrating an embodiment of a communication device supporting IEEE (Institute of Electrical & Electronics Engineers) 802.11b functionality in accordance with certain aspects of the invention. This diagram shows how IEEE 802.11b WLAN functionality may be implemented on a small, single-sided module that can be optimized for handheld applications. The following diagram (FIG. 7) shows how an optional BLUETOOTH® populate option on a second side of the board for users who may want an extremely broad range of operations and communication systems types in which the communication device may operate and thereby providing an extremely versatile range in wireless connectivity.

Referring to the FIG. 6, an IEEE 802.11b functional block may be implemented as a monolithic, single chip. A dual antenna approach may be employed for diversity in dealing with undesirable deleterious effects such as multi-path effects. A diversity antenna switch may be used to select either one or both of the 2 antennae of the communication device. A Tx/Rx switch coupled to the diversity antenna switch determines whether to be transferred to the receive or transmit paths of the communication device. The receive path includes a balun whose output is then communicatively coupled to the radio. The transmit path, extending from the radio, communicatively couples to a balun, then to a PA (Power Amplifier), and off-chip to a BPF (Band Pass Filter), and then back through the Tx/Rx switch. The interface between the PA and the off-chip BPF may be implemented using the novel off-chip LC circuit approach presented and described herein. The communicatively coupling ensures that the ground and VDD potentials of the PCB on which the IEEE 802.11b functional block (which is implemented as a single, monolithic integrated circuit) is mounted are effectively brought onto the die of the integrated circuit of the IEEE 802.11b functional block.

As mentioned above, this IEEE 802.11b functional block can be employed as a single chip IEEE 802.11b implementation. An extremely efficient means of integration is performed to include a radio, an IEEE 802.11b baseband processor, a MAC (Medium Access Controller), a PA (Power Amplifier), and all other RF (Radio Frequency) components that would typically be found on a LAN (Local Area Network) circuit board. However, all of these components can now be provided within a single integrated circuit. The radio may be implemented to perform direct conversion of a signal from a carrier frequency to a baseband signal. For example, the radio may be implemented to perform direct conversion of a 2.4 GHz signal to a baseband signal using components having an all CMOS (Complementary Metal Oxide Semiconductor) design. This all-CMOS implementation of the radio provides for a significant decrease in power consumption and a reduction in many, many components thereby providing for improved power management (e.g., power reduction) and also thereby providing for a more affordable communication device that can perform wireless connectivity. Such a communication device having this implementation can have an extended battery life due to the low power all-CMOS design and the comprehensive power management performed therein. The comprehensive power management approach can improve the battery life by creating a deep sleep state when the communication device is in a stand-by mode. Some of the high performance and interfacing features of this communication device include SDIO (Secure Digital Input/Output), SDIO with a BLUETOOTH® option, SPI (Serial Peripheral Interface), CF (Compact Flash), and PCMCIA (Personal Computer Miniature Communications Interface Adapter).

Figure 7:
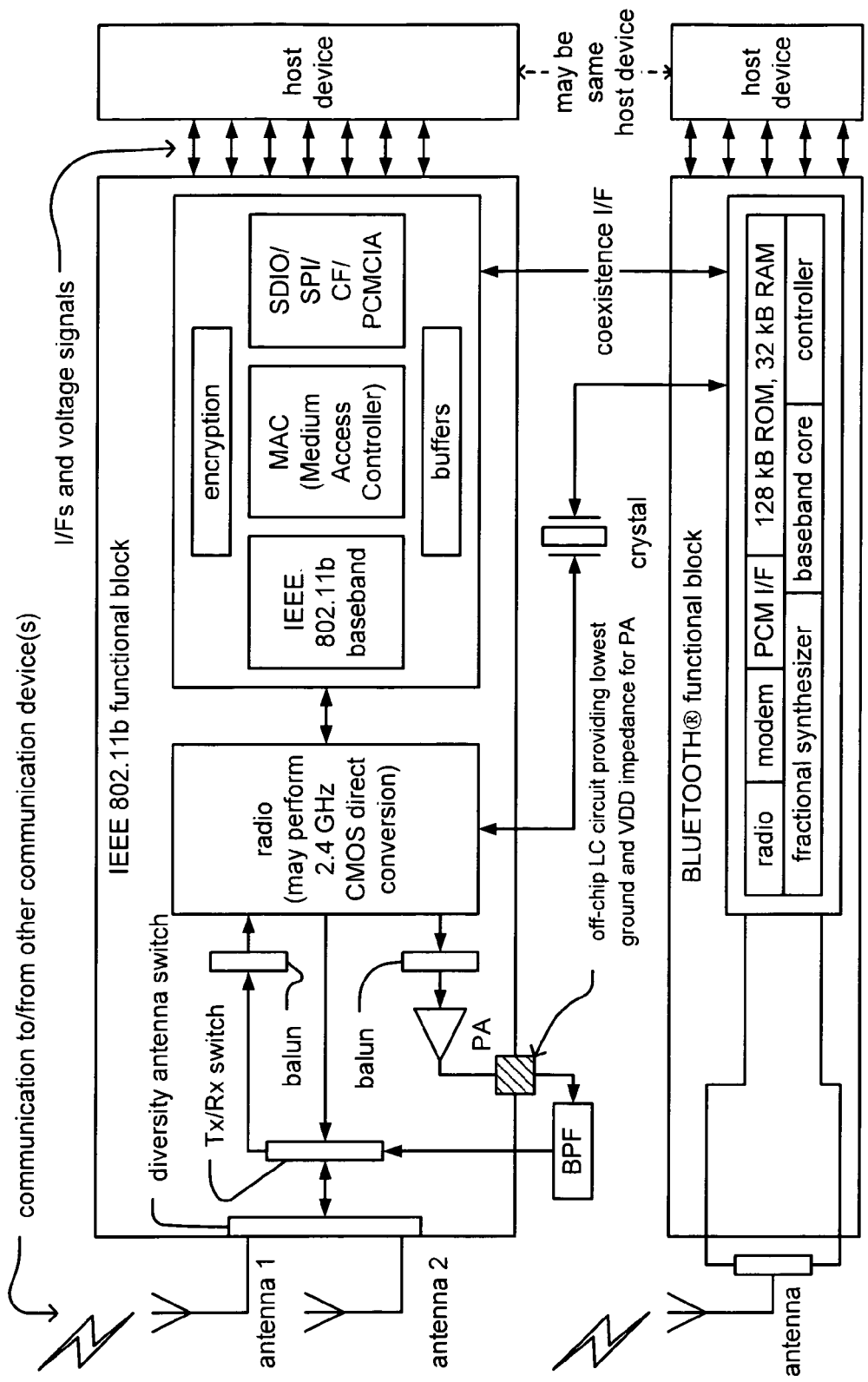
FIG. 7 is a diagram illustrating an embodiment of a communication device supporting both IEEE 802.11b functionality and BLUETOOTH® functionality in accordance with certain aspects of the invention.

FIG. 7 is a diagram illustrating an embodiment of a communication device supporting both IEEE 802.11b functionality and BLUETOOTH® functionality in accordance with certain aspects of the invention. This embodiment shows a coexistence I/F (interface) between an IEEE 802.11b functional block and a BLUETOOTH® functional block. Each of these two functional blocks may be individual chips. Together, these chipsets cooperatively can provide for IEEE 802.11b functionality and BLUETOOTH® functionality. This combination of these two separate functional blocks effectively addresses the size, power, cost, interface, manufacturing, and ease of deployment issues necessary for a solution targeted at the handheld wireless market.

This coexistence may be implemented in a very compact wireless device by mounting the IEEE 802.11b functional block as an integrated circuit on one side of a PCB, and the BLUETOOTH® functional block as another integrated circuit on the other side of the very same PCB. This coexistence interface between the WLAN (e.g., IEEE 802.11b) and the BLUETOOTH® chipsets ensures an optimal simultaneous performance of both of the wireless communication protocols.

Figure 8:
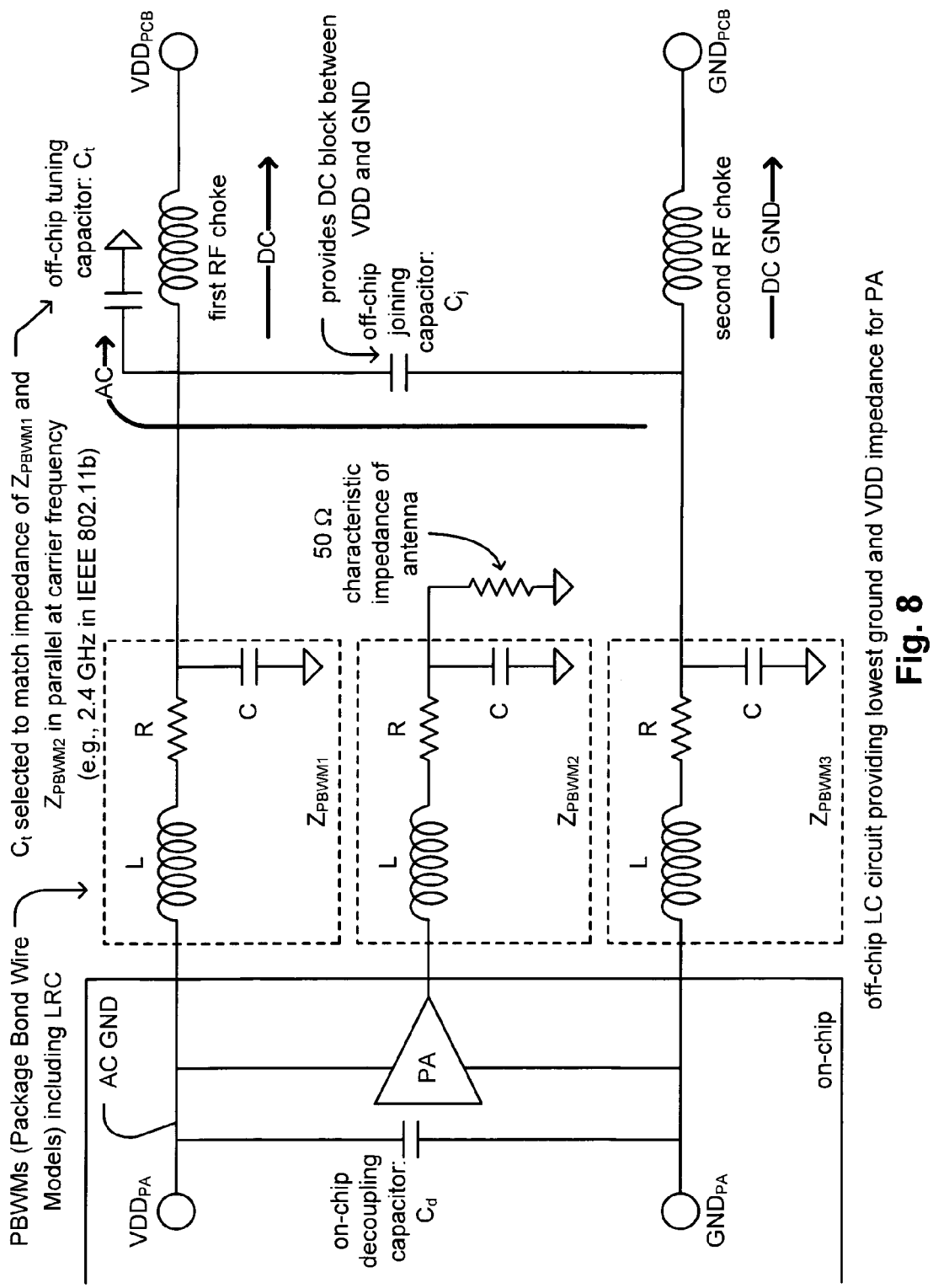
FIG. 8 is a diagram illustrating an embodiment of an off-chip LC circuit providing lowest ground and VDD impedance for a PA (Power Amplifier) in accordance with certain aspects of the invention.

FIG. 8 is a diagram illustrating an embodiment of an off-chip LC circuit providing lowest ground and VDD impedance for a PA (Power Amplifier) in accordance with certain aspects of the invention. This diagram is shown with respect to the chip to off-chip interface of an integrated circuit from the perspective of a PA (Power Amplifier). The chip to PCB interface within this diagram is shown using a PBWM (Package Bond Wire Model) that includes an inductor, L, in series with a resistor, R, and a capacitor, C, shunted to ground. Each chip to PCB interface may be represented using this PBWM. The nodes corresponding to the supply potential level and the ground potential levels on the PCB are shown as $VDD_{PCB}$ and $GND_{PCB}$, respectively. Similarly, the nodes corresponding to the supply potential level and ground potential levels within the chip (e.g., within the "package") and at the nodes of the PA are shown as $VDD_{PA}$ and $GND_{PA}$, respectively.

Within the chip, an on-chip decoupling capacitor, $C_d$, is provided between the $VDD_{PA}$ and $GND_{PA}$ nodes within the chip. In addition, joining capacitor, $C_j$, is provided off-chip. The interface between the output of the PA (which is physically on-chip) to the antenna that the PA drives (which is physically off-chip) is shown using a PBWM. The output of this PBWM is communicatively coupled to the antenna. The characteristic impedance of the antenna typically around a value of approximately 50 Ω.

The outputs of each of the $VDD_{PA}$ and $GND_{PA}$ nodes from within the chip, shown as being modeled by PBWMs, communicatively couple to the $VDD_{PCB}$ and $GND_{PCB}$ nodes that are off-chip via two separate RF chokes (e.g., inductors). Each of these RF chokes serves essentially as a shunt of the DC (Direct Current) voltage levels between the outputs of each of the $VDD_{PA}$ and $GND_{PA}$ nodes from within the chip to the $VDD_{PCB}$ and $GND_{PCB}$ nodes that are off-chip. In addition, each of these RF chokes serves as an AC (Alternating Current) open circuit with respect to the $VDD_{PCB}$ and $GND_{PCB}$ nodes that are off-chip thereby blocking any AC component being passed to/from these nodes on the PCB. Also, an off-chip tuning capacitor, $C_t$, is shunted to ground from the node just to the left of the RF choke communicatively coupled to the $VDD_{PCB}$ node. This ground to which the off-chip tuning capacitor, $C_t$, is shunted may be viewed as being the off-chip true ground potential node. In contradistinction, these other VDD and ground potential levels associated with the other various nodes described herein (e.g., the $VDD_{PCB}$ and $GND_{PCB}$ nodes and the $VDD_{PA}$ and $GND_{PA}$ nodes) may all be floating voltage supply levels and ground potential levels. This off-chip tuning capacitor, $C_t$, allows for a path for all AC signal components to be shunted to ground.

The off-chip joining capacitor, $C_j$, and the on-chip decoupling capacitor, $C_d$, operate cooperatively to make the bond wires for each of the $VDD_{PA}$ and $GND_{PA}$ nodes to be effectively in parallel thereby reducing the overall effective inductance of the bond wires associated with these nodes. The off-chip tuning capacitor, $C_t$, allows for a tuning out of the combined inductance of the various wire bonds used to interface the nodes of the PA to off-chip locations. As also mentioned above, the two separate RF chokes provide an effective AC open circuit with respect to the $VDD_{PCB}$ and $GND_{PCB}$ nodes that are off-chip to make the tuning possible that is to be performed by the off-chip tuning capacitor, $C_t$. The value to which this off-chip tuning capacitor, $C_t$, is tuned is based on the combined impedances of the 2 PBWMs that extend from the $VDD_{PA}$ and $GND_{PA}$ nodes from within the chip.

$Z_{PBWM1}$=impedance of a $1^{st}$ PBWM $Z_{PBWM2}$=impedance of a $2^{nd}$ PBWM $Z_{C_t}$=negative reactance generated by the off-chip tuning capacitor, $C_t$ $$-\frac{1}{Z_{C_t}} = \frac{1}{Z_{PBWM1}} + \frac{1}{Z_{PBWM2}}, \text{ where } Z_{C_t}$$

$$= -j \cdot \left(\frac{1}{\omega C_t}\right)$$

-continued $$= -j \cdot \left(\frac{1}{2\pi f \cdot C_t}\right)$$

Within an IEEE 802.11b WLAN communication system, the carrier frequency, f, is approximately 2.4 GHz. The negative reactance generated by the off-chip tuning capacitor, $C_t$, is tuned to cancel the combined, parallel, impedance of the two PBWMs. These PBWMs model the interfaces between the $VDD_{PA}$ and $GND_{PA}$ nodes (that are within the chip) to their respective off-chip locations. This tuning that is performed by the off-chip tuning capacitor, $C_t$, is used to cancel the effects of the total inductance of the combination of the two parallel bond wire paths extending from the chip (e.g., as shown by the PBWMs associated each of the $VDD_{PA}$ and $GND_{PA}$ nodes from within the chip).

This off-chip circuit includes the off-chip tuning capacitor, $C_t$, the off-chip joining capacitor, $C_j$, and the 2 RF chokes, that all operate in conjunction with one another with the on-chip decoupling capacitor, $C_d$, to bring the PCB ground potential onto the die of the chip in which the PA is implemented. That is to say, this off-chip circuit (along with the on-chip decoupling capacitor) provides a means by which the ground and VDD potential levels may be effectively brought onto the die of the chip in which the PA is implemented. This ensures that the on-chip value for ground is actually the "true ground" of the communication device. Each of the $GND_{PA}$ node within the chip and the $GND_{PCB}$ node that is off-chip are both held at the "true ground" potential (e.g., held effectively to the same potential).

Figure 9:
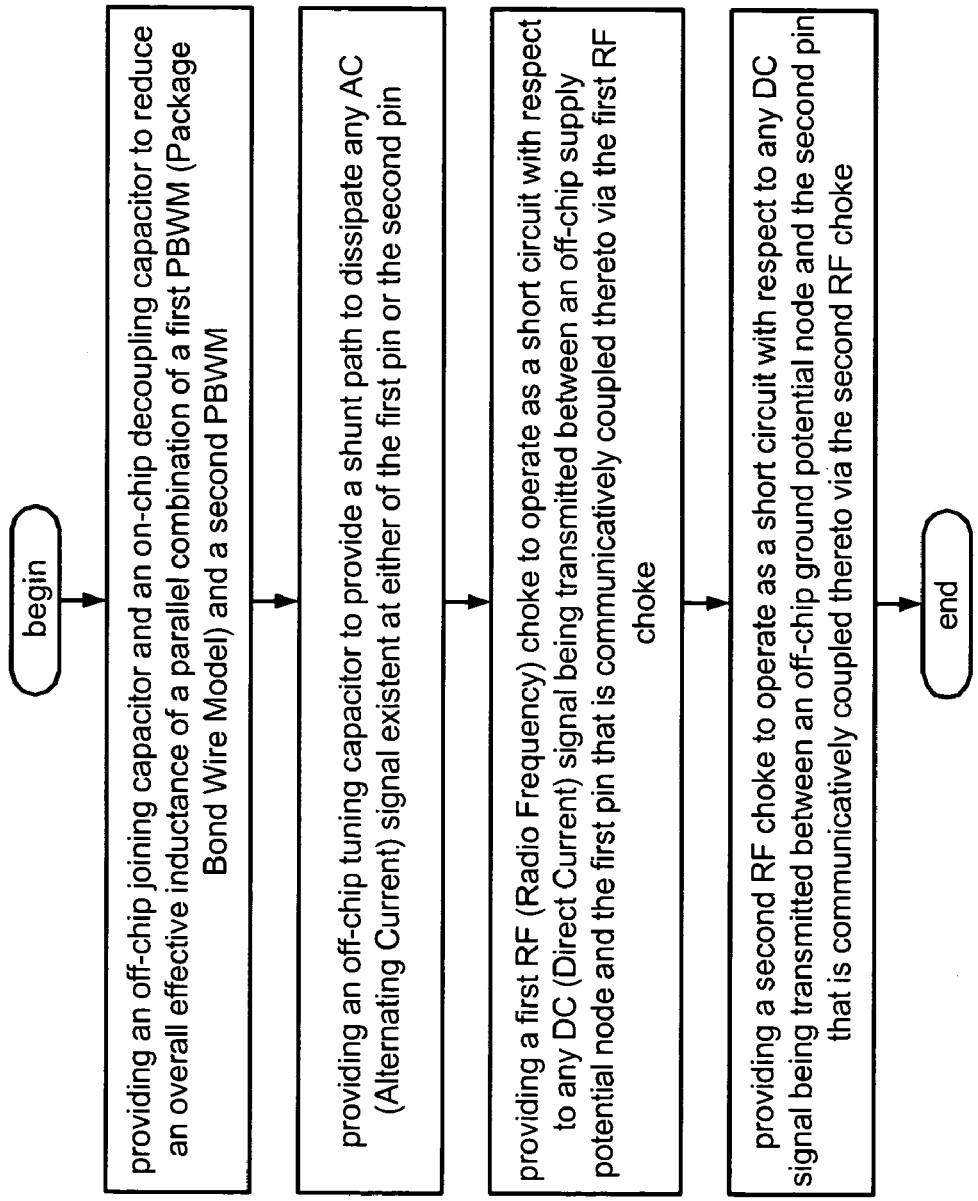
FIG. 9 is a flowchart illustrating an embodiment of a method for providing a lowest ground potential and an off-chip supply potential (e.g., VDD) impedance to an on-chip PA (Power Amplifier) according to certain aspects of the invention.

FIG. 9 is a flowchart illustrating an embodiment of a method for providing a lowest ground potential and an off-chip supply potential (e.g., VDD) impedance to an on-chip PA (Power Amplifier) according to certain aspects of the invention. The method involves providing an off-chip joining capacitor and an on-chip decoupling capacitor to reduce an overall effective inductance of a parallel combination of a first PBWM (Package Bond Wire Model) and a second PBWM. Each of these PBWMs correspond to the off-chip to on-chip (e.g., substrate) interface that includes a pin and a bond wire. The method also involves providing an off-chip tuning capacitor to provide a shunt path to dissipate any AC (Alternating Current) signal existent at either of the pins.

The method also involves providing a first RF (Radio Frequency) choke to operate as a short circuit with respect to any DC (Direct Current) signal being transmitted between an off-chip supply potential node and the first pin that is communicatively coupled thereto. The method also involves providing a second RF choke to operate as a short circuit with respect to any DC signal being transmitted between an off-chip ground potential node and the second pin that is communicatively coupled thereto.

In general, the method operates by using the off-chip joining capacitor and the on-chip decoupling capacitor to reduce the overall effective inductance of each of the PBWMs that is communicatively coupled via the RF chokes to the $VDD_{PA}$ and $GND_{PA}$, respectively.

It is also noted that various methods may be performed, in accordance with the invention, in a manner similar to the operation and functionality of the various system and/or apparatus embodiments described above. In addition, such methods may be viewed as being performed within any of the appropriate system and/or apparatus embodiments (communication systems, communication transmitters, communication receivers, communication transceivers, and/or functionality described therein) that are described above without departing from the scope and spirit of the invention.

In view of the above detailed description of the invention and associated drawings, other modifications and variations will now become apparent. It should also be apparent that such other modifications and variations may be effected without departing from the spirit and scope of the invention.

What is claimed is:

1. An off-chip LC (inductance-capacitance) circuit that communicatively couples to an integrated circuit, the circuit comprising:
    a first RF (Radio Frequency) choke that communicatively couples an off-chip supply potential node to a first pin of the integrated circuit;
    wherein the first pin connects to an on-chip supply potential node of a die that is implemented within the integrated circuit;
    wherein the on-chip supply potential node powers an on-chip PA (Power Amplifier) that is implemented within the die;
    a second RF choke that communicatively couples an off-chip ground potential node to a second pin of the integrated circuit;
    wherein the second pin connects to an on-chip ground potential node of the die;
    wherein the on-chip ground potential node serves as an on-chip ground reference of the on-chip PA;
    an off-chip joining capacitor whose ends communicatively couple to each of the first pin and the second pin of the integrated circuit; and
    an off-chip tuning capacitor whose ends communicatively couple to the first pin of the integrated circuit and an off-chip true ground potential node.

2. The circuit of claim 1, wherein:
    the integrated circuit includes an on-chip decoupling capacitor whose ends communicatively couple to the on-chip supply potential node and the on-chip ground potential node.

3. The circuit of claim 1, wherein:
    the first pin connects to the on-chip supply potential node of the die via a first bond wire;
    the second pin connects to the on-chip ground potential node of the die via a second bond wire;
    a third pin of the integrated circuit connects to an output of the on-chip PA via a third bond wire;
    a first interface from an exterior of the integrated circuit to the die of the integrated circuit that includes the first pin and the first bond wire is characterized by a first PBWM (Package Bond Wire Model) having a first impedance;
    a second interface from the exterior of the integrated circuit to the die of the integrated circuit that includes the second pin and the second bond wire is characterized by a second PBWM having a second impedance; and
    a third interface from the exterior of the integrated circuit to the die of the integrated circuit that includes the third pin and the third bond wire is characterized by a third PBWM having a third impedance.

4. The circuit of claim 3, wherein:
    the third pin is communicatively coupled to an antenna.

5. The circuit of claim 3, wherein:
    the integrated circuit includes an on-chip decoupling capacitor whose ends communicatively couple to the on-chip supply potential node and the on-chip ground potential node; and
    the on-chip decoupling capacitor and the off-chip joining capacitor operate cooperatively to reduce an effective inductance associated with each of the first PBWM and the second PBWM.

6. The circuit of claim 3, wherein:
    a capacitance value of the off-chip tuning capacitor is selected such that the capacitive-related impedance corresponding to the off-chip tuning capacitor substantially cancels a parallel combination of the first impedance and the second impedance that correspond to the first PBWM and the second PBWM, respectively.

7. The circuit of claim 1, wherein:
    the first RF choke substantially blocks any AC (Alternating Current) signal from being transmitted between the off-chip supply potential node and the first pin; and
    the second RF choke substantially blocks any AC signal from being transmitted between the off-chip ground potential node and the second pin.

8. The circuit of claim 1, wherein:
    the first RF choke operates as a short circuit with respect to any DC (Direct Current) signal being transmitted between the off-chip supply potential node and the first pin; and
    the second RF choke operates as a short circuit with respect to any DC signal being transmitted between the off-chip ground potential node and the second pin.

9. The circuit of claim 1, wherein:
    the off-chip tuning capacitor and the off-chip joining capacitor cooperatively provide a shunt path to dissipate for any AC (Alternating Current) signal existent at either of the first pin or the second pin.

10. The circuit of claim 1, wherein:
    the integrated circuit is implemented within a communication device that supports wireless communication according to at least one of an IEEE (Institute of Electrical & Electronics Engineers) 802.11b standard and an IEEE 802.15.1 BLUETOOTH® core.

11. An off-chip LC (inductance-capacitance) circuit that communicatively couples to an integrated circuit, the circuit comprising:
    a first RF (Radio Frequency) choke that communicatively couples an off-chip supply potential node to a first pin of the integrated circuit;
    wherein the first pin connects to an on-chip supply potential node of a die that is implemented within the integrated circuit;
    wherein the on-chip supply potential node powers an on-chip PA (Power Amplifier) that is implemented within the die;
    a second RF choke that communicatively couples an off-chip ground potential node to a second pin of the integrated circuit;
    wherein the second pin connects to an on-chip ground potential node of the die;
    wherein the on-chip ground potential node serves as an on-chip ground reference of the on-chip PA;
    an off-chip joining capacitor whose ends communicatively couple to each of the first pin and the second pin of the integrated circuit;
    an off-chip tuning capacitor whose ends communicatively couple to the first pin of the integrated circuit and an off-chip true ground potential node;
    wherein the integrated circuit includes an on-chip decoupling capacitor whose ends communicatively couple to the on-chip supply potential node and the on-chip ground potential node;

wherein the first pin connects to the on-chip supply potential node of the die via a first bond wire;

wherein the second pin connects to the on-chip ground potential node of the die via a second bond wire;

a third pin of the integrated circuit connects to an output of the on-chip PA via a third bond wire;

a first interface from an exterior of the integrated circuit to the die of the integrated circuit that includes the first pin and the first bond wire is characterized by a first PBWM (Package Bond Wire Model) having a first impedance;

a second interface from the exterior of the integrated circuit to the die of the integrated circuit that includes the second pin and the second bond wire is characterized by a second PBWM having a second impedance; and a third interface from the exterior of the integrated circuit to the die of the integrated circuit that includes the third pin and the third bond wire is characterized by a third PBWM having a third impedance.

12. The circuit of claim 11, wherein:

the on-chip decoupling capacitor and the off-chip joining capacitor operate cooperatively to reduce an effective inductance associated with each of the first PBWM and the second PBWM.

13. The circuit of claim 11, wherein:

a capacitance value of the off-chip tuning capacitor is selected such that the capacitive-related impedance corresponding to the off-chip tuning capacitor substantially cancels a parallel combination of the first impedance and the second impedance that correspond to the first PBWM and the second PBWM, respectively.

14. The circuit of claim 11, wherein:

the first RF choke substantially blocks any AC (Alternating Current) signal from being transmitted between the off-chip supply potential node and the first pin;

the second RF choke substantially blocks any AC signal from being transmitted between the off-chip ground potential node and the second pin;

the first RF choke operates as a short circuit with respect to any DC (Direct Current) signal being transmitted between the off-chip supply potential node and the first pin;

the second RF choke operates as a short circuit with respect to any DC signal being transmitted between the off-chip ground potential node and the second pin; and the off-chip tuning capacitor and the off-chip joining capacitor cooperatively provide a shunt path to dissipate for any AC (Alternating Current) signal existent at either of the first pin or the second pin.

15. The circuit of claim 11, wherein:

the integrated circuit is implemented within a communication device that supports wireless communication according to at least one of an IEEE (Institute of Electrical & Electronics Engineers) 802.11b standard and an IEEE 802.15.1 BLUETOOTH® core.

16. A method for providing a lowest ground potential and an off-chip supply potential impedance to an on-chip PA (Power Amplifier), the method comprising:

providing an off-chip joining capacitor and an on-chip decoupling capacitor to reduce an overall effective inductance of a parallel combination of a first PBWM (Package Bond Wire Model) and a second PBWM;

wherein the first PBWM characterizes a first interface from an exterior of an integrated circuit to a die of the integrated circuit that includes a first pin and a first bond wire;

wherein the second PBWM characterizes a second interface from the exterior of the integrated circuit to the die of the integrated circuit that includes a second pin and a second bond wire;

providing an off-chip tuning capacitor to provide a shunt path to dissipate any AC (Alternating Current) signal existent at either of the first pin or the second pin;

providing a first RF (Radio Frequency) choke to operate as a short circuit with respect to any DC (Direct Current) signal being transmitted between an off-chip supply potential node and the first pin that is communicatively coupled thereto via the first RF choke; and providing a second RF choke to operate as a short circuit with respect to any DC signal being transmitted between an off-chip ground potential node and the second pin that is communicatively coupled thereto via the second RF choke.

17. The method of claim 16, further comprising:

selecting a capacitance value of the off-chip tuning capacitor such that the capacitive-related impedance corresponding to the off-chip tuning capacitor substantially cancels a parallel combination of a first impedance and a second impedance that correspond to the first PBWM and the second PBWM, respectively.

18. The method of claim 16, wherein the first RF choke substantially blocks any AC (Alternating Current) signal from being transmitted between the off-chip supply potential node and the first pin; and the second RF choke substantially blocks any AC signal from being transmitted between the off-chip ground potential node and the second pin.

19. The method of claim 16, wherein:

the first RF choke operates as a short circuit with respect to any DC (Direct Current) signal being transmitted between the off-chip supply potential node and the first pin; and the second RF choke operates as a short circuit with respect to any DC signal being transmitted between the off-chip ground potential node and the second pin.

20. The method of claim 16, wherein:

the method is performed within a communication device that supports wireless communication according to at least one of an IEEE (Institute of Electrical & Electronics Engineers) 802.11b standard and an IEEE 802.15.1 BLUETOOTH® core.

* * * * *